US012301134B2

(12) United States Patent
Fan et al.

(10) Patent No.: US 12,301,134 B2
(45) Date of Patent: *May 13, 2025

(54) INVERTER-BASED COMPARATOR

(71) Applicants: NCKU Research and Development Foundation, Tainan (TW); Himax Technologies Limited, Tainan (TW)

(72) Inventors: Philex Ming-Yan Fan, Tainan (TW); Yi-Fu Chen, Tainan (TW); Bo-Rui Chen, Tainan (TW)

(73) Assignees: NCKU Research and Development Foundation, Tainan (TW); Himax Technologies Limited, Tainan (TW)

( * ) Notice: Subject to any disclaimer, the term of this patent is extended or adjusted under 35 U.S.C. 154(b) by 284 days.

This patent is subject to a terminal disclaimer.

(21) Appl. No.: 18/095,399

(22) Filed: Jan. 10, 2023

(65) Prior Publication Data

US 2024/0235426 A1 Jul. 11, 2024

(51) Int. Cl.
*H03K 5/24* (2006.01)
*H02M 1/00* (2006.01)
*H02M 7/5387* (2007.01)

(52) U.S. Cl.
CPC ..... *H02M 7/53873* (2013.01); *H02M 1/0032* (2021.05); *H03K 5/24* (2013.01); *H03K 5/2472* (2013.01); *H02M 1/0048* (2021.05)

(58) Field of Classification Search
CPC .. H03K 5/00; H03K 5/22; H03K 5/24; H03K 5/2436; H03K 5/2454; H03K 5/2472; H03K 5/2481; H03K 5/249; H03K 17/223; H03K 17/0822; H03K 17/687; H03K 19/20; H02M 1/0032; H02M 1/0045; H02M 1/0048; H02M 7/53873; G05F 1/10; G05F 1/46; G05F 1/461; G05F 1/56; G05F 1/575; G05F 1/59; G05F 3/08; G05F 3/10
See application file for complete search history.

(56) References Cited

U.S. PATENT DOCUMENTS

| 5,936,434 A * | 8/1999 | Kumamoto | H03K 5/2481 327/337 |
| 10,910,946 B2 * | 2/2021 | Schaef | H02M 3/158 |
| 2004/0080346 A1 * | 4/2004 | Haruhana | H03K 5/249 327/129 |
| 2005/0017770 A1 * | 1/2005 | Arai | H03K 5/249 327/124 |

(Continued)

*Primary Examiner* — Thienvu V Tran
*Assistant Examiner* — Shahzeb K Ahmad
(74) *Attorney, Agent, or Firm* — Donald E. Stout; Stout, Uxa & Buyan, LLP

(57) ABSTRACT

An inverter-based comparator, powered between a first supply voltage and a second supply voltage being lower than the first supply voltage, includes a first inverter branch composed of at least one first P-type transistor and at least one first N-type transistor; and a second inverter branch composed of at least one second P-type transistor, at least one second N-type transistor and at least two tuning switches. The first inverter branch and the second inverter branch are configured to compare an input voltage with an internal trigger point, thereby generating a compare voltage at an interconnected node. One of the at least two tuning switches is controlled to isolate the first supply voltage and another is controlled to isolate the second supply voltage to compensate for trigger point shifting.

8 Claims, 3 Drawing Sheets

(56) References Cited

U.S. PATENT DOCUMENTS

| | | | | |
|---|---|---|---|---|
| 2013/0002149 A1* | 1/2013 | Mott | ................. | H03K 17/6872 |
| | | | | 315/161 |
| 2014/0306751 A1* | 10/2014 | Nakamoto | ................ | G05F 1/10 |
| | | | | 327/541 |
| 2017/0047910 A1* | 2/2017 | Thelen, Jr. | ............. | H03K 19/20 |
| 2020/0278710 A1* | 9/2020 | Sankman | ................ | G05F 1/575 |

* cited by examiner

INVERTER-BASED COMPARATOR

BACKGROUND OF THE INVENTION

1. Field of the Invention

The present invention generally relates to a comparator, and more particularly to an inverter-based comparator.

2. Description of Related Art

Power management integrated circuit (PMIC) is designed to controllably switch a system to a low-power state when inactive, in order to obtain high power conversion efficiency in static operating mode, thereby substantially extending the battery lifetime, for example, in a low power consumption system such as Internet of things (IoT).

Conventional power management ICs use a comparator or an error amplifier for monitoring the output voltage to ensure a stable output voltage and proper load performance. Accordingly, the power management ICs demand always-on comparator or error amplifier, which nonetheless consumes non-negligible power, reduces power conversion efficiency and increases quiescent power, thereby resulting in reduced battery lifetime.

Moreover, the comparator adopted in the conventional power management ICs makes comparison by comparing the input voltage with a reference voltage, which is externally generated by a reference voltage generating circuit that consumes extra power and circuit area.

A need has thus arisen to propose a novel low-power comparator adaptable to low-power power management systems.

SUMMARY OF THE INVENTION

In view of the foregoing, it is an object of the embodiment of the present invention to provide an inverter-based comparator with a cascoded inverter capable of substantially reducing power consumption and tuning a trigger point thereof.

According to one embodiment, an inverter-based comparator, powered between a first supply voltage and a second supply voltage being lower than the first supply voltage, includes a first inverter branch and a second inverter branch. The first inverter branch is composed of at least one first P-type transistor and at least one first N-type transistor. The second inverter branch is composed of at least one second P-type transistor, at least one second N-type transistor and at least two tuning switches. The first inverter branch and the second inverter branch are configured to compare an input voltage with an internal trigger point, thereby generating a compare voltage at an interconnected node. One of the at least two tuning switches is controlled to isolate the first supply voltage and another is controlled to isolate the second supply voltage to compensate for trigger point shifting.

DETAILED DESCRIPTION OF THE INVENTION

Figure 1:
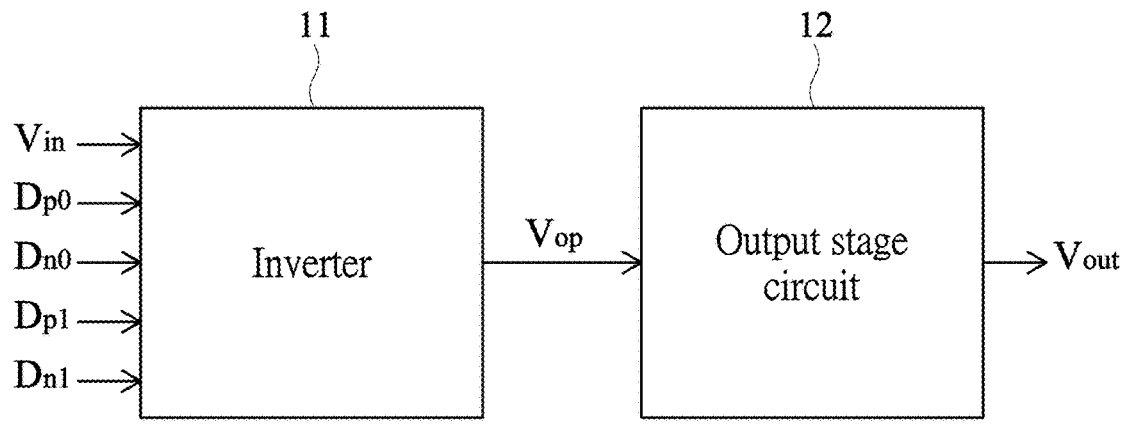
FIG. 1 shows a block diagram illustrating an inverter-based comparator adaptable to low-power power management systems according to one embodiment of the present invention.
Figure 2:
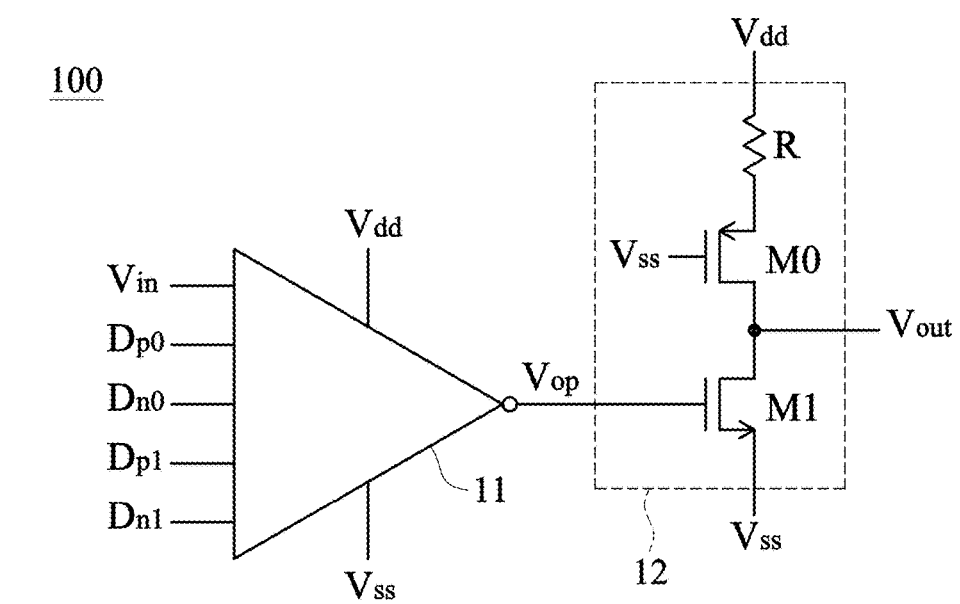
FIG. 2 shows a circuit diagram exemplifying the inverter-based comparator of FIG. 1.

FIG. 1 shows a block diagram illustrating an inverter-based comparator 100 adaptable to low-power power management systems according to one embodiment of the present invention, and FIG. 2 shows a circuit diagram exemplifying the inverter-based comparator 100 of FIG. 1.

In the embodiment, the inverter-based comparator 100 may include an inverter 11 coupled to receive an input voltage $V_{in}$ and configured to compare the input voltage $V_{in}$ with an (internal) trigger point that is internally determined according to the inverter 11 itself, thereby generating a compare voltage $V_{op}$ indicating comparison result. As the inverter 11 of the inverter-based comparator 100 makes comparison by comparing the input voltage $V_{in}$ with the internally generated trigger point, instead of an externally provided reference voltage, the inverter-based comparator 100 can substantially reduce power consumption and circuit area. In one embodiment, the inverter 11 is preferably a cascoded inverter, which adopts a cascode structure acquiring more transistor channel length, and current leakage when the input voltage $V_{in}$ is near the trigger point can be greatly reduced, thereby further reducing overall power consumption.

According to one aspect of the embodiment, the trigger point of the inverter 11 may be tuned (or adjusted) by at least one (e.g., digital) tuning signal ($D_{n0}$-$D_{n1}$ and $D_{p0}$-$D_{p1}$ as exemplified in FIG. 1 and FIG. 2) that is externally provided, in order to compensate for trigger point shifting due to process variation.

The inverter-based comparator 100 of the embodiment may include an output stage circuit 12 coupled to receive the compare voltage $V_{op}$ and configured to ensure a state for the compare voltage $V_{op}$, thereby generating an output voltage $V_{out}$ at an output node (of the inverter-based comparator 100).

Specifically, the output stage circuit 12 may include a resistor R, a P-type transistor (e.g., P-type metal-oxide-semiconductor (PMOS) transistor) M0 and an N-type transistor (e.g., N-type metal-oxide-semiconductor (NMOS) transistor) M1, which are connected in series in an order from a first supply voltage (e.g., positive supply voltage $V_{dd}$) to a second supply voltage (e.g., negative supply voltage $V_{ss}$) being lower than the first supply voltage, with a gate of the PMOS transistor M0 coupled to the second supply voltage $V_{ss}$, a gate of the NMOS transistor M1 coupled to the compare voltage $V_{op}$, and drains of the PMOS transistor M0 and the NMOS transistor M1 connected at the output node (of the inverter-based comparator 100) for providing the output voltage $V_{out}$.

In operation, when a gate-to-source voltage of the NMOS transistor M1 is greater than a corresponding threshold voltage, the NMOS transistor M1 is turned on and the output voltage $V_{out}$ is pulled down to the second supply voltage $V_{ss}$, otherwise the NMOS transistor M1 is turned off and the output voltage $V_{out}$ is pulled up to the first supply voltage $V_{dd}$ via the resistor R, thereby ensuring that the output voltage $V_{out}$ represents the state of the compare voltage $V_{op}$.

Figure 3:
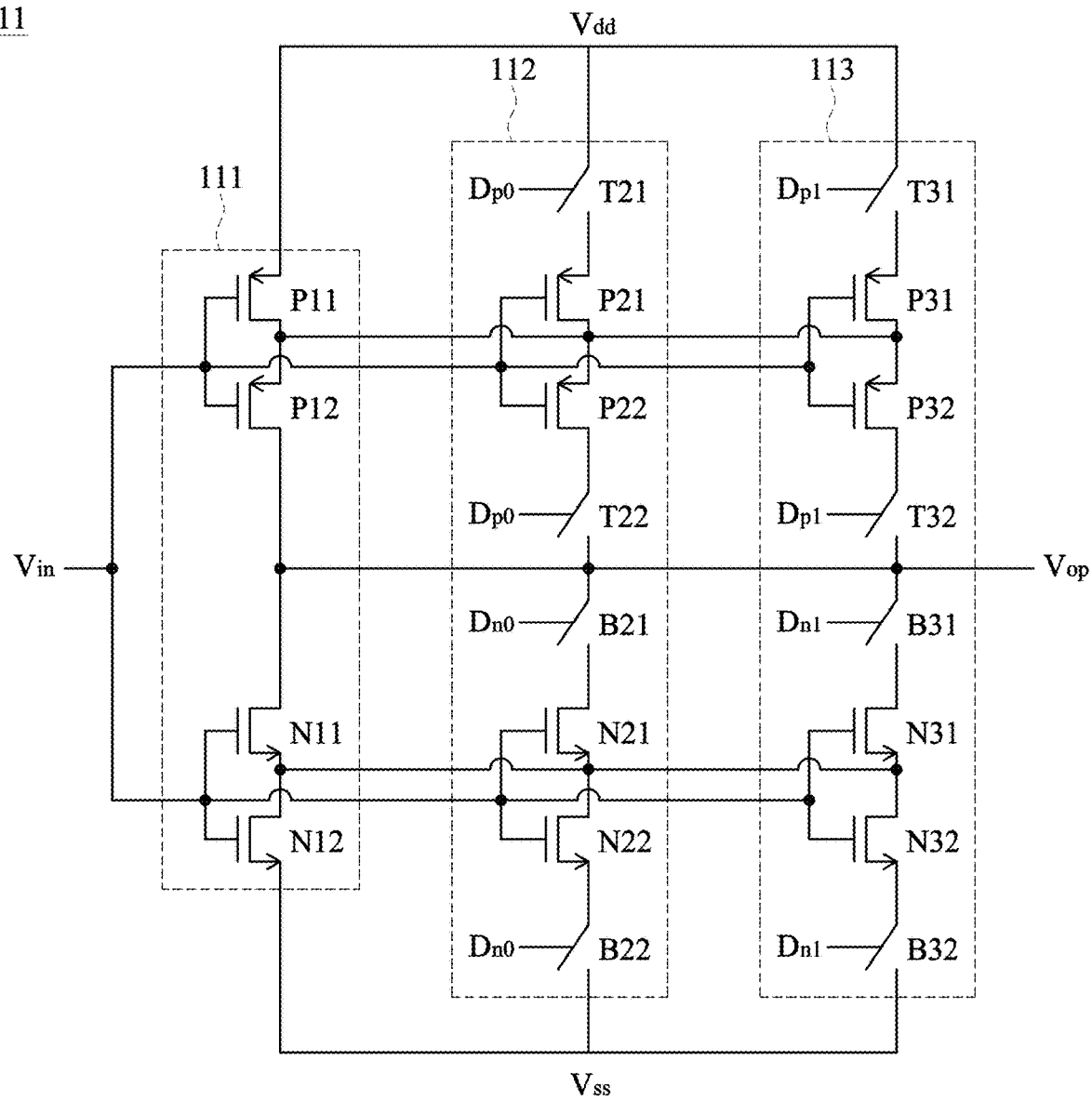
FIG. 3 shows a detailed circuit diagram illustrating the inverter of FIG. 2 according to one embodiment of the present invention.

FIG. 3 shows a detailed circuit diagram illustrating the inverter (preferably a cascoded inverter) 11 of FIG. 2 according to one embodiment of the present invention.

Specifically, the cascoded inverter 11 of the embodiment may include a first inverter branch 111 composed of series-connected first PMOS transistors P11-P12 and series-connected first NMOS transistors N11-N12, which are electrically connected in series in the order from the first supply voltage $V_{dd}$ to the second supply voltage $V_{ss}$. Gates of the series-connected first PMOS transistors P11-P12 and the series-connected first NMOS transistors N11-N12 are coupled to the input voltage $V_{in}$, and an interconnected node electrically coupled between the series-connected first PMOS transistors P11-P12 and the series-connected first NMOS transistors N11-N12 provides the compare voltage $V_{op}$. Alternatively, for a non-cascode embodiment, the first inverter branch 111 may be composed of a first PMOS transistor P11 and a first NMOS transistor N11, which are electrically connected in series in the order from the first supply voltage $V_{dd}$ to the second supply voltage $V_{ss}$.

Figure 4:
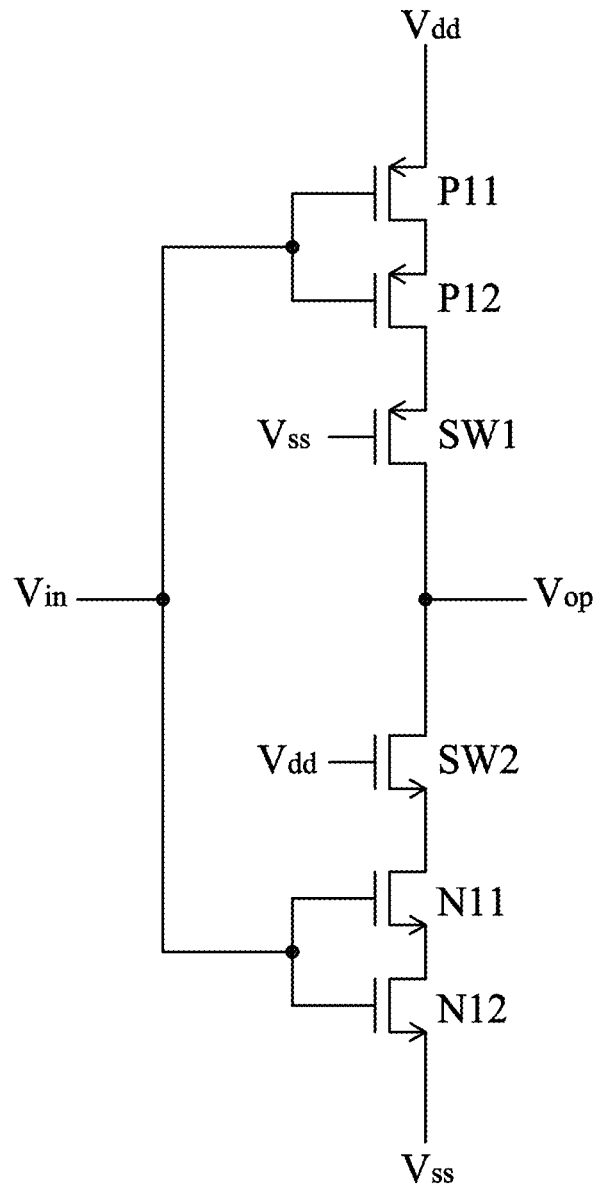
FIG. 4 shows a circuit diagram illustrating the first inverter branch of FIG. 3 according to another embodiment of the present invention.

FIG. 4 shows a circuit diagram illustrating the first inverter branch 111 of FIG. 3 according to another embodiment of the present invention. Specifically, the first inverter branch 111 may further include a first switch SW1 (e.g., PMOS transistor) connected between the series-connected first PMOS transistors P11-P12 and the interconnected node $V_{op}$, and a second switch SW2 (e.g., NMOS transistor) connected between the series-connected first NMOS transistors N11-N12 and the interconnected node $V_{op}$. The gate of the first switch SW1 may, for example, be coupled to the second supply voltage $V_{ss}$, and the gate of the second switch SW2 may, for example, be coupled to the first supply voltage $V_{dd}$ as exemplified in FIG. 4.

Referring back to FIG. 3, the cascoded inverter 11 of the embodiment may include a second inverter branch 112 composed of series-connected second PMOS transistors P21-P22 and series-connected second NMOS transistors N21-N22, which are electrically connected in series in the order from the first supply voltage $V_{dd}$ to the second supply voltage $V_{ss}$. Gates of the series-connected second PMOS transistors P21-P22 and the series-connected second NMOS transistors N21-N22 are coupled to the input voltage $V_{in}$, and the series-connected second PMOS transistors P21-P22 and the series-connected second NMOS transistors N21-N22 are electrically connected at the interconnected node that provides the compare voltage $V_{op}$. Alternatively, for a non-cascode embodiment, the second inverter branch 112 may be composed of a second PMOS transistor P21 and a second NMOS transistor N21, which are electrically connected in series in the order from the first supply voltage $V_{dd}$ to the second supply voltage $V_{ss}$. Moreover, the first switch SW1 and the second switch SW2 as illustrated in FIG. 4 may be adopted in the second inverter branch 112.

According to one aspect of the embodiment, the second inverter branch 112 may further include at least two tuning switches controlled by at least one tuning signal, and configured to isolate the first supply voltage $V_{dd}$ and the second supply voltage $V_{ss}$ respectively. Each tuning switch may be composed of one MOS transistor, or be composed of two MOS transistors connected in parallel to act as a transmission gate. In one embodiment, the at least two tuning switches may include a top switch (controlled by a first tuning signal $D_{p0}$) connected between the first supply voltage $V_{dd}$ and the series-connected second PMOS transistors P21-P22 as denoted by T21, or connected between the series-connected second PMOS transistors P21-P22 and the interconnected node $V_{op}$ as denoted by T22; and include a bottom switch (controlled by a second tuning signal $D_{n0}$) connected between the interconnected node $V_{op}$ and the series-connected second NMOS transistors N21-N22 as denoted by B21, or connected between the series-connected second NMOS transistors N21-N22 and the second supply voltage $V_{ss}$ as denoted by B22. In an alternative embodiment, the at least two tuning switches may include two top switches T21 and T22, and include two bottom switches B21 and B22.

Similarly, the cascoded inverter 11 of the embodiment may optionally include an third inverter branch 113 composed of series-connected third PMOS transistors P31-P32 and series-connected third NMOS transistors N31-N32, which are electrically connected in series in the order from the first supply voltage $V_{dd}$ to the second supply voltage $V_{ss}$. Gates of the series-connected third PMOS transistors P31-P32 and the series-connected third NMOS transistors N31-N32 are coupled to the input voltage $V_{in}$, and the series-connected third PMOS transistors P31-P32 and the series-connected third NMOS transistors N31-N32 are electrically connected at the interconnected node that provides the compare voltage $V_{op}$. Alternatively, for a non-cascode embodiment, the third inverter branch 113 may be composed of a third PMOS transistor P31 and a third NMOS transistor N31, which are electrically connected in series in the order from the first supply voltage $V_{dd}$ to the second supply voltage $V_{ss}$. Moreover, the first switch SW1 and the second switch SW2 as illustrated in FIG. 4 may be adopted in the third inverter branch 113. It is appreciated that, in another embodiment, the third inverter branch 113 may be omitted or a fourth inverter branch or branches like the second/third inverter branch 112/113 may be further included.

According to the aspect of the embodiment, the third inverter branch 113 may further include at least two tuning switches controlled by at least one tuning signal, and configured to isolate the first supply voltage $V_{dd}$ and the second supply voltage $V_{ss}$, respectively. Each tuning switch may be composed of one MOS transistor, or be composed of two MOS transistors connected in parallel to act as a transmission gate. In one embodiment, the at least two tuning switches may include a top switch (controlled by a third tuning signal $D_{p1}$) connected between the first supply voltage $V_{dd}$ and the series-connected third PMOS transistors P31-P32 as denoted by T31, or connected between the series-connected third PMOS transistors P31-P32 and the interconnected node $V_{op}$ as denoted by T32; and include a bottom switch (controlled by a fourth tuning signal $D_{n1}$) connected between the interconnected node $V_{op}$ and the series-connected third NMOS transistors N31-N32 as denoted by B31, or connected between the series-connected third NMOS transistors N31-N32 and the second supply voltage $V_{ss}$ as denoted by B32. In an alternative embodiment, the at least two tuning switches may include two top switches T31 and T32, and include two bottom switches B31 and B32. Interlinked nodes of the series-connected first PMOS transistors P11-P12, the series-connected second PMOS transistors P21-P22 and the series-connected third PMOS transistors P31-P32 may be connected together, and interlinked node of the series-connected first NMOS transistors N11-N12, the series-connected second NMOS transistors N21-N22 and the series-connected third NMOS transistors N31-N32 may be connected together.

Although specific embodiments have been illustrated and described, it will be appreciated by those skilled in the art that various modifications may be made without departing from the scope of the present invention, which is intended to be limited solely by the appended claims.

What is claimed is:

1. An inverter-based comparator powered between a first supply voltage and a second supply voltage being lower than the first supply voltage, comprising:
   a first inverter branch composed of at least one first P-type transistor and at least one first N-type transistor; and
   a second inverter branch composed of at least one second P-type transistor, at least one second N-type transistor and at least two tuning switches;
   wherein the first inverter branch and the second inverter branch are configured to compare an input voltage with an internal trigger point, thereby generating a compare voltage at an interconnected node; and
   one of the at least two tuning switches is controlled to isolate the first supply voltage and another is controlled to isolate the second supply voltage to compensate for trigger point shifting;
   wherein the at least one first P-type transistor comprises series-connected first P-type transistors, the at least one first N-type transistor comprises series-connected first N-type transistors, the at least one second P-type transistor comprises series-connected second P-type transistors, or the at least one second N-type transistor comprises series-connected second N-type transistors.

2. The inverter-based comparator of claim 1, wherein the second inverter branch is coupled to receive at least one tuning signal for controlling the at least two tuning switches.

3. The inverter-based comparator of claim 1, wherein the at least one first P-type transistor and the at least one first N-type transistor are electrically connected in series in an order from the first supply voltage to the second supply voltage, gates of the at least one first P-type transistor and the at least one first N-type transistor are coupled to the input voltage, and the interconnected node electrically coupled between the at least one first P-type transistor and the at least one first N-type transistor provides the compare voltage.

4. The inverter-based comparator of claim 1, wherein the at least one second P-type transistor and the at least one second N-type transistor are electrically connected in series in the order from the first supply voltage to the second supply voltage, gates of the at least one second P-type transistor and the at least one second N-type transistor are coupled to the input voltage, and the at least one second P-type transistor and the at least one second N-type transistor are electrically coupled at the interconnected node.

5. The inverter-based comparator of claim 1, wherein the at least two tuning switches comprise:
   a top switch connected between the first supply voltage and the at least one second P-type transistor or between the interconnected node and the at least one second P-type transistor; and
   a bottom switch connected between the second supply voltage and the at least one second N-type transistor or between the interconnected node and the at least one second N-type transistor.

6. The inverter-based comparator of claim 1, further comprising:
   an output stage circuit coupled to receive the compare voltage and configured to ensure a state for the compare voltage, thereby generating an output voltage at an output node.

7. The inverter-based comparator of claim 6, wherein the output stage circuit comprises a resistor, a P-type transistor and an N-type transistor, which are connected in series in an order from the first supply voltage to the second supply voltage, with a gate of the P-type transistor coupled to the second supply voltage, a gate of the N-type transistor coupled to the compare voltage, and drains of the P-type transistor and the N-type transistor connected at the output node.

8. An inverter-based comparator powered between a first supply voltage and a second supply voltage being lower than the first supply voltage, comprising:
   a first inverter branch composed of at least one first P-type transistor and at least one first N-type transistor; and
   a second inverter branch composed of at least one second P-type transistor, at least one second N-type transistor and at least two tuning switches;
   wherein the first inverter branch and the second inverter branch are configured to compare an input voltage with an internal trigger point, thereby generating a compare voltage at an interconnected node; and
   one of the at least two tuning switches is controlled to isolate the first supply voltage and another is controlled to isolate the second supply voltage to compensate for trigger point shifting;
   wherein the at least two tuning switches comprise:
      two top switches respectively connected between the first supply voltage and the at least one second P-type transistor and between the interconnected node and the at least one second P-type transistor; and
      two bottom switches respectively connected between the second supply voltage and the at least one second N-type transistor and between the interconnected node and the at least one second N-type transistor.

\* \* \* \* \*